(12) United States Patent
Shimada et al.

(10) Patent No.: US 8,433,530 B2
(45) Date of Patent: Apr. 30, 2013

(54) SYSTEM AND METHOD FOR MONITORING AND MANAGEMENT OF UTILITY USAGE

(75) Inventors: Jun Shimada, New York, NY (US); Mei Shibata, New York, NY (US); Joel David Eaves, New York, NY (US)

(73) Assignee: ThinkEco, Inc., New York, NY (US)

( * ) Notice: Subject to any disclaimer, the term of this patent is extended or adjusted under 35 U.S.C. 154(b) by 848 days.

(21) Appl. No.: 12/284,051

(22) Filed: Sep. 18, 2008

(65) Prior Publication Data

US 2010/0070217 A1    Mar. 18, 2010

(51) Int. Cl.
*G01R 21/00* (2006.01)
*G01R 11/56* (2006.01)
*H02B 1/00* (2006.01)
*H01H 9/54* (2006.01)

(52) U.S. Cl.
USPC ............ 702/62; 705/412; 361/659; 307/140

(58) Field of Classification Search ............ 702/62, 702/57, 60–61, 64–66, 70–71, 81, 84, 127, 702/182–183, 188–189; 323/234, 241, 318, 323/364, 367, 369; 361/600–601, 622, 641, 361/659–661; 700/286, 291–292, 295; 705/412; 307/11, 29, 31, 112–113, 125, 130–131, 307/132 E, 139–140
See application file for complete search history.

(56) References Cited

U.S. PATENT DOCUMENTS

| | | |
|---|---|---|
| 8,140,279 B2 * | 3/2012 | Subbloie .................. 702/61 |
| 2009/0079416 A1 * | 3/2009 | Vinden et al. ............ 324/103 R |
| 2009/0195349 A1 | 8/2009 | Frader-Thompson et al. |
| 2010/0145542 A1 * | 6/2010 | Chapel et al. ............ 700/295 |

FOREIGN PATENT DOCUMENTS

EP    1220412 A1    7/2002

\* cited by examiner

*Primary Examiner* — Toan Le
(74) *Attorney, Agent, or Firm* — Dorf & Nelson LLP; Scott D. Locke, Esq.

(57) ABSTRACT

A system and method is provided to enable consumers to intelligently manage their consumption of energy. In one embodiment, waveform data is collected for a plurality of appliances which may be found in a residential or commercial setting using a plurality of multi-port outlet monitoring devices. The collected waveform data is processed and analyzed to obtain power consumption profiles that indicate power consumption on a per-appliance and/or per-outlet basis and/or per user basis.

34 Claims, 14 Drawing Sheets

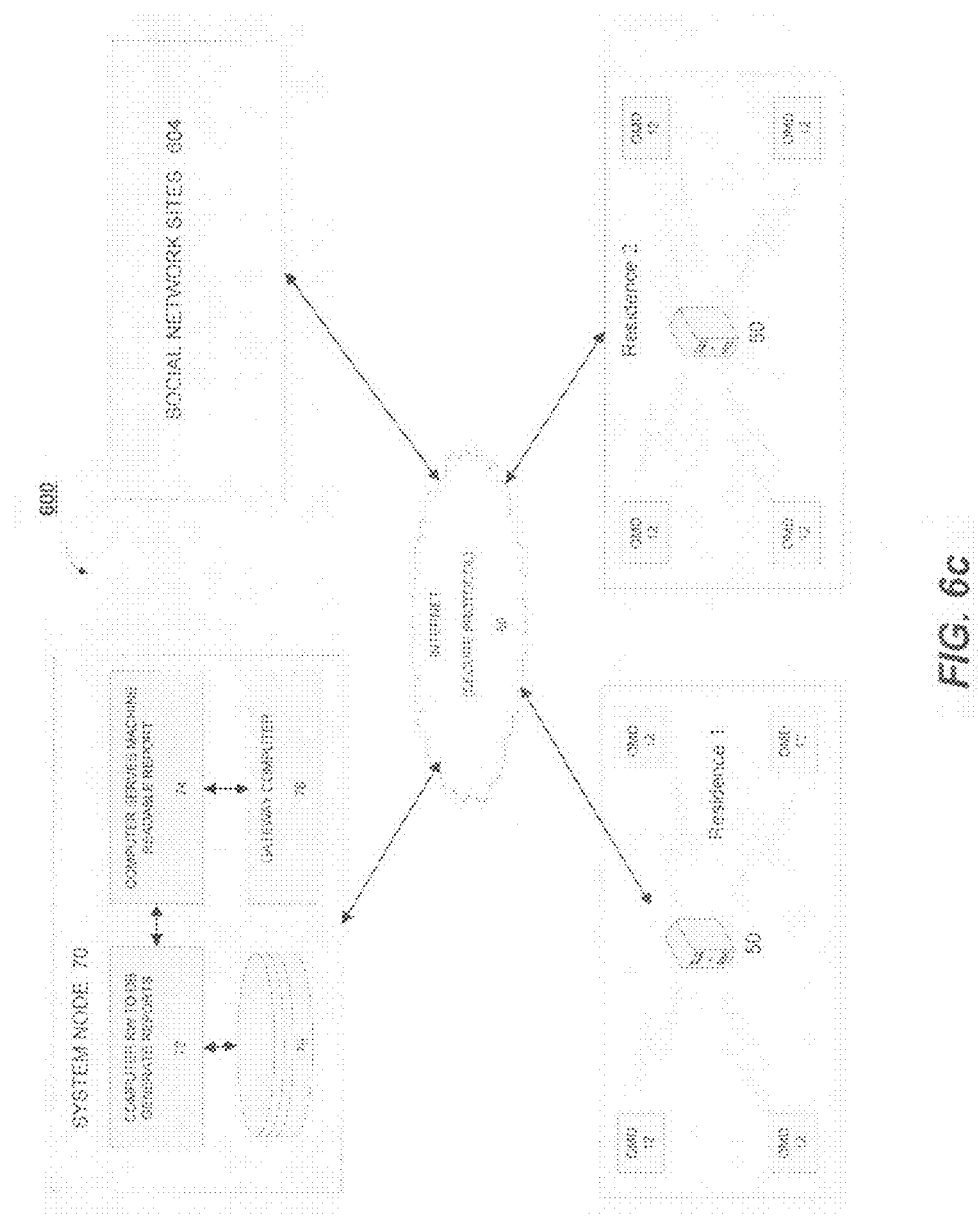

Device Power Signature Table

| Device Link | Power Signature param 1 | Power Signature tolerance 1 | Power Signature param 2 | Power Signature tolerance 2 | Power Signature param 3 | Power Signature tolerance 3 |
|---|---|---|---|---|---|---|
| Desk Lamp | 0.45 | 0.02 | 0.54 | 0.04 | 19 | 0.08 |
| Laptop | 0.87 | 0.03 | 0.21 | 0.01 | 14 | 0.02 |
| Razor | 0.54 | 0.03 | 0.41 | 0.01 | 23 | 0.1 |

FIGURE 8

Usage Table — 900

| Device FK (902) | User FK (904) | Start Time (906) | Stop Time (908) | Power Draw (910) |
|---|---|---|---|---|
| 2 | 1 | 8:00 PM | 8:01 PM | 100 Watts |
| 2 | 1 | 8:03 PM | 8:05 PM | 40 Watts |
| 2 | 1 | 9:23 PM | 10:03 PM | 65 Watts |
| 2 | 1 | 10:15 PM | 10:33 PM | 92 Watts |
| 3 | 1 | 11:00 PM | 11:55 PM | 49 Watts |

FIGURE 9

User Table 1000

| Name 1002 | ID 1004 | Address 1006 | Email 1008 | Demographic 1010 | User Since 1012 | Dwelling Type 1014 |
|---|---|---|---|---|---|---|
| Jill | XZ2533 | Queens, NY | Jill@aol.com | $120K income | 1/2009 | single-occupancy |
| Joe | XZ2534 | Boston, MA | joe@gmail.com | 4 in household | 2/2009 | apartment |
| Jon | YZ0452 | Seattle, WA | jon@yahoo.com | Age 54 | 6/2009 | multiplex |
| Steve | FX3453 | Minnesota, MN | steve@comcast.net | Male | 5/2009 | apartment |

FIGURE 10

SYSTEM AND METHOD FOR MONITORING AND MANAGEMENT OF UTILITY USAGE

BACKGROUND OF THE INVENTION

1. Field of the Invention

The present invention generally relates to methods and systems for utility usage monitoring and management.

2. Description of the Related Art

With serious concerns regarding global warming on the rise, civic and corporate efforts to improve energy conservation have steadily increased. Major US cities, for example, have independently vowed to reduce their emissions level to 7% below 1990 levels by 2012. New developers, perhaps in response to rising market and civic pressures, have started to adhere to standards set by the US Green Building Council's Leadership in Energy and Environmental Design (LEED) program. Finally, many corporations are initiating green corporate energy marketing campaigns and increasing green product lines wherever possible.

In response to increasing media coverage of global warming, the average consumer's desire to reduce carbon emissions is at an all-time high, with 61% of the population seeing global warming as a real concern. Unfortunately, there are no cost-effective and systematic ways today to convert this desire into a rigorous, measurable conservation effort. On one hand, typical and easy ways for individuals to conserve resources are very hard to quantify (e.g., taking shorter showers). On the other, serious conservation efforts (such as solar energy conversions) are very expensive and require significant lifestyle changes. Furthermore, when consumers do try to conserve, they are unable to see the impact of their collective efforts. This lack of information discourages conservation efforts, and may partly explain why most people rely on corporations and the government to spearhead the majority of green efforts.

Within this context, households are unfortunately becoming a growing source of $CO_2$ emissions. Scientists believe that electricity generated by coal plants contributes to 25% of US $CO_2$ emissions. According to 2005 figures, a remarkable 20% of electricity that is distributed to residential, commercial, or industrial endpoints is wasted. This amounts to $1.2 \times 10^{13}$ lbs of $CO_2$ emitted per year. And as house sizes have increased and electronic devices become more widespread, the fraction of wasted electricity attributable to the residential sector grew from 23% in 1950 to 30% in 2005.

Meanwhile, the cost of electricity has increased much faster than inflation. Nationwide, average utility bills increased by an average of 30% from 2003 to 2008, the sharpest jump since the 1970s energy crisis. This has posed severe challenges for many family budgets, and the number of households falling behind on utility payments—and of utility shutoffs—has soared.

Most of the increase in electricity cost is due to an increase in the cost of fuels. The cost of many forms of coal nearly doubled from summer 2007 to summer 2008, and the prices of natural gas (which closely tracks the price of oil) has soared in recent years. Nuclear power is expensive and requires very large investments, and also suffers from the taint of weapons programs and NIMBY-based opposition. Hydroelectric power is difficult to scale further, since most rivers that can be dammed have already been. Solar and wind energy are expensive and remain very small scale. It is therefore unlikely that any combination of the above will scale up to meet new demand within the next few years, let alone to satisfy the potential policy goal of reducing coal usage. Consequently, many of the highest-impact solutions to our energy problems will be those that allow individuals to control and reduce their electricity demand.

What is needed is a technology that can (a) help empower the average consumer to take control of his/her electricity consumption by collecting data at a sufficiently granular level to promote conservation, and (b) allow the consumer to see the cumulative quantitative impact of her/her conservation efforts in conjunction with other consumers. Furthermore, the technology should be easy to install and use, thus motivating individuals to act on their growing eco-consciousness and desire to save money. By doing so, the technology would help to reduce the free-rider problem inherent in energy usage today and decrease our overall carbon footprint.

The present invention addresses these concerns.

SUMMARY OF THE INVENTION

It therefore is an object of the invention to enable consumers to intelligently manage the consumption of electricity by multiple users and/or multiple loads within a residential or commercial setting.

It is a related object of the invention to provide a system and method for collecting waveform data for a plurality of appliances that may be found in a residential or commercial setting using multi-port outlet monitoring devices (OMDs) to obtain power consumption profiles that indicate power consumption on a per-appliance and/or per-location basis and/or per user basis.

As a method for enabling a consumer to intelligently mange the consumption of energy by multiple users and/or multiple loads within a residential or commercial setting, one embodiment of the invention includes at least the operations of: independently metering waveform data comprising at least one characteristic of electrical energy consumed by a plurality of loads by a corresponding plurality of multi-port monitoring devices (OMDs), independently metering waveform data by at least one of the multi-port monitoring device (OMD) from among the plurality of multi-port monitoring devices (OMDs) at least one characteristic of electrical energy consumed by at least two loads simultaneously coupled to respective lower and upper outlets of the at least one of the multi-port monitoring devices (OMDs), transmitting the waveform data to a system controller, and analyzing the waveform data at the system controller to determine at least one energy consumption profile.

As a system for enabling a consumer to intelligently manage the consumption of energy by multiple users and/or multiple loads within a residential or commercial setting, one embodiment of the invention includes at least: a plurality of multi-port outlet monitoring devices (OMDs) wirelessly connected to a system controller that collects and analyzes waveform data. Each multi-port outlet monitoring device (OMD) being associated with one or more corresponding common household appliances that identifies at least one electrical load of the consumer site. The system controller includes means for receiving waveform data (e.g., voltage and current values) measured by the respective multi-port outlet monitoring devices (OMDs), a memory associated with the system controller for storing the waveform data, and at least one processor for computing parameter values related to power consumption from the waveform data to obtain information related to power consumption and means for distributing the power consumption related parameter values to interested parties.

As a computer readable medium including at least computer program code for enabling a consumer to intelligently manage the consumption of energy by multiple users and/or multiple loads within a residential or commercial setting, one embodiment of the invention includes at least: computer program code for independently metering waveform data comprising at least one characteristic of electrical energy consumed by a plurality of loads by a corresponding plurality of multi-port monitoring devices (OMDs), independently metering waveform data by at least one of the multi-port monitoring device from among the plurality of multi-port monitoring devices (OMDs) at least one characteristic of electrical energy consumed by at least two loads simultaneously coupled to respective lower and upper outlets of the at least one of the multi-port monitoring devices (OMDs), transmitting the waveform data to a system controller, and analyzing the waveform data at the system controller to determine at least one energy consumption profile. The computer code may include the further operation of resolving the waveform data according to user time, location, or appliance or combinations thereof.

BRIEF DESCRIPTION OF THE DRAWINGS

These and other objects, features and advantages of the invention will be apparent from a consideration of the following Detailed Description Of The Invention considered in conjunction with the drawing Figures, in which:

FIGS. 6a, 6b & 6c illustrate the system controller and interface for communicating with a plurality of OMDs

FIG. 8 is a field description of a Device Power Signature Table, according to one embodiment.

FIG. 9 is a field description of a Usage Table, according to one embodiment.

FIG. 10 is a field description of a User Table, according to one embodiment.

DETAILED DESCRIPTION OF THE INVENTION

Figure 1:
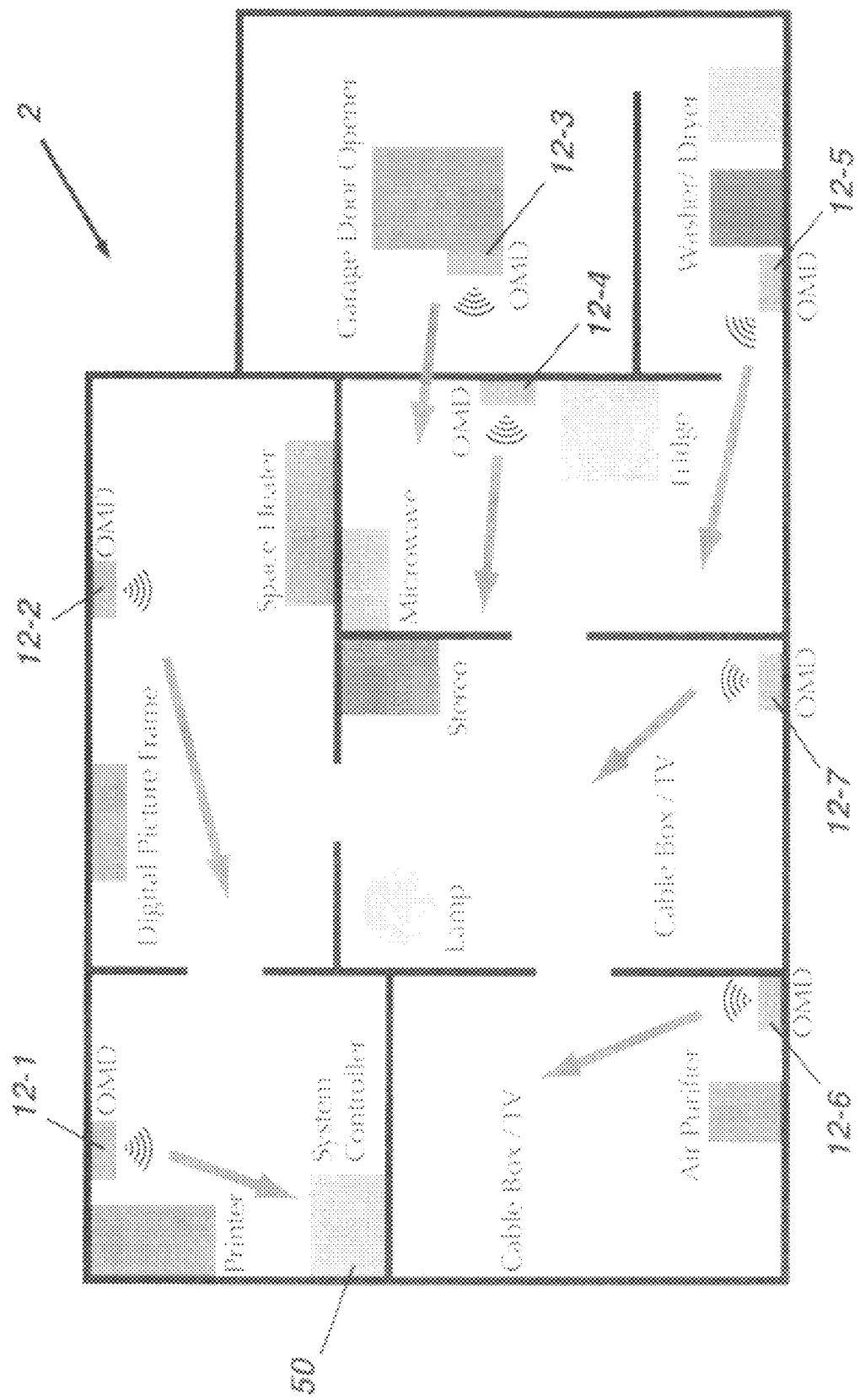
FIG. 1 is a pictorial diagram of an exemplary residence in which a system of the invention may be used.

In the following discussion, numerous specific details are set forth to provide a thorough understanding of the present invention. But those skilled in the art will appreciate that the present invention may be practiced without such specific details. In other instances, well-known elements have been illustrated in schematic or block diagram form in order not to obscure the present invention in unnecessary detail. Details concerning network communications, electromagnetic signaling techniques and the like have been omitted inasmuch as such details are not considered necessary to obtain a complete understanding of the present invention. Such details are considered to be within the understanding of persons of ordinary skill in the relevant art.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes so that the reader can understand the principles of the disclosure and the concepts contributed by the inventor to furthering the art. These examples are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

DEFINITIONS

The term appliance as used herein refers to any device that may be electrically coupled to a wall socket.

The terms multiplexing or muxing and mux as used herein refers to the generation of a single, combined data stream from two or more input streams of data.

The term de-muxing as used herein refers to the inverse process of muxing, where one recovers the original signals that have been multiplexed.

The term waveform data as used herein refers to current and/or voltage as a function of time. It may also refer to the power as a function of time.

I. Introduction

According to embodiments of the invention, a metering system and associated method is provided for metering the consumption of electrical energy by multiple loads and/or multiple users within a residential or commercial setting. The metering system of the invention is suitable for use with existing residential electrical distribution systems without modification.

According to one aspect of the invention, energy consumption data may be used to compute consumption profiles of consumer sites (e.g., participating households). The energy consumption profiles may also be used to compute an aggregate energy consumption profile of a group of consumer sites (e.g., a community, town, county, etc.). Further, the consumption profile associated with a particular monitored appliance along with an aggregate consumption profile of similar appliances may be used to identify actual energy consumption differences between the monitored appliance and the energy consumption of similar monitored appliances.

According to another aspect of the invention, the energy consumption profiles may be aggregated from each consumer site and communicated to a centralized proprietary database dedicated to consumer electricity and appliance usage data. Generic demographic information may be generated from the data for use in cross-referencing against individual consumer consumption data. In some embodiments, the types of information that may be collected may include, for example, consumer electricity and appliance usage patterns, electrical consumption patterns of appliances, and geographic breakdown of electricity consumption patterns. The information may be used to inform customers about best practices on electricity consumption vis-à-vis collected real-use data on appliances, which will drive increased awareness among customers to purchase energy-efficient electrical appliances. This will in turn drive appliance makers to make their appliances more energy efficient and appealing to consumers. In an embodiment, geographic and demographic data are collected pertaining to how electricity is being used, which may be of strategic value to the pricing practices of power companies and policy making of government affiliated agencies.

According to one aspect of the invention, energy consumption may also be identified per consumer site member. Looking beyond the specific consumer site, the system provides capabilities to provide summary data for community conservation efforts as well as a forum for exchanging conservation ideas. The system can further serve as a platform for civic efforts at reducing emissions. For example, cities may turn to the system to have their conservation efforts officially measured and broadly recognized.

Parties interested in the analyzed energy consumption data may include any one of the following: consumers, a power utility, a power analyst, a power broker, government agency, regulatory agency, and appliance manufacturers. In an embodiment, a World Wide Web interface is provided to permit the interested parties access to the energy consumption information.

Advantages of the system may include, for example, identification of energy consumption on a per appliance basis and/or per consumer site member and/or per site room, thereby providing capabilities to track energy consumption at a highly granular level. Further advantages include summarizing energy consumption data per appliance to quantify energy efficiency levels beyond the commonly known "EnergyStar" label or other similar efficiency rating systems.

Residential Embodiment

Referring now to FIG. 1, there is shown a pictorial diagram of an exemplary residence 2 in which a system of the invention may be used. Although the system described here applies to metering the energy consumption within a residential setting including, without limitation, a single family residence or a multiple family residence, such as an apartment building, it is apparent to those skilled in the art and guided by the teachings provided herein that the system may be used in other suitable settings, including commercial, industrial and utility applications.

The system includes a general-purpose computer system, such as system controller 50, installed with a general-purpose operating system (e.g., Intel-based operating system, Unix-based operating system, etc.) including application software to provide necessary functionality of operations described herein. System controller 50 includes an interface (not shown) for communicating with a plurality of outlet monitoring devices (OMDs) 12-1 through 12-7 of the system, via wireless links, wired links or combinations thereof. The OMDs 12 are communicably coupled to various electrical outlets found within the residence 2. The outlets found within a residence are generally installed in a per-room and/or per-floor basis. For example, as shown here for simplicity, the OMDs 12 are shown for a specific group of rooms.

In at least one embodiment, system controller 50 is configured to receive data pertaining to at least one characteristic of the electrical energy consumed by appliances distributed throughout the residential setting 2 as monitored by the plurality of OMDs 12-1 through 12-7 of the system.

The plurality of OMDs 12 transmit at least one characteristic of the electrical consumption, such as current, voltage, or power waveform data to an interface of the system controller 50. The interface is capable of receiving time-stamped secure packet messages from each OMD 12. The interface queues the data packet transmissions from the respective OMDs 12 in the order they were received.

In one embodiment, the OMDs 12 communicate with system controller 50 via wireless links using a low-power wireless communications protocol such as the ZigBee protocol or the like. ZigBee is built on an Institute of Electrical and Electronics Engineers (IEEE) global standard, 802.15.4, similar to the standards that govern Bluetooth and Wi-Fi.

In one embodiment, current and voltage waveform data are transmitted from the OMDs 12 with a 16-bit resolution and sampled at a rate of 1 kHz at each outlet. In such an embodiment, the data rate from a given OMD 12 (for a single outlet configuration) can therefore be computed as 32 kbits/sec (1 kHz*16 bits per data sample*2 waveforms). For a two outlet configuration, the required data transmission speed from an OMD 12 is 64 kbit/s, which is well within Zigbee's 250 kbit/s capacity in the 2.4 GHz band.

The outlet monitoring devices (OMDs) 12 are configured to transmit metering data to the system controller 50, either periodically or on demand. Each outlet monitoring device (OMD) 12 is configured to meter a voltage circuit via an electrical outlet.

System Controller

System controller 50 includes software configured to save, organize and analyze the metering data transmitted from one or more OMDs 12 in one embodiment. Each OMD 12 is assigned a unique address to allow system controller 50 to determine which OMD 12 is interacting with system controller 50. Additionally, using the address, system controller 50 can transmit communication signals to selected OMDs 12 as needed. For example, a single OMD 12 may be selected by system controller 50 to turn "on" or "off" any appliances connected to either or both sockets of the OMD 12. An OMD 12 may also be selected by the system controller 50 to request a transmission from the selected OMD 12.

Organization of the metering data comprises the system controller 50 individually metering and logging consumption of energy, for example, by each load of multiple loads or by each user of multiple users. Other methods of summarizing energy consumption data are within contemplation of the invention as will be apparent to the reader. For example, users may choose to summarize by location (e.g. living room) or by one or more device characteristics (e.g. rechargeable devices). System controller 50 is configured to access the metering data and log the metering data to generate a summary of the metering data for energy consumption by each load and/or each user. Using the summary of the metering data, a cost for energy consumption for each user and/or each load can be calculated and the usage and/or consumption of energy by multiple users and/or multiple loads can be better managed.

The system controller 50 obtains metering data by processing the waveform data from OMD 12 using proprietary signal processing algorithms. In one embodiment, the processed data will be analyzed by a proprietary appliance detection system (ADS) to analyze the OMD signal to identify the appliance connected to the OMD 12. In the event that the ADS cannot make a positive identification of an appliance, the customer will be prompted to identify the appliance so that the ADS can "learn" to associate the OMD signal with the newly identified appliance. In one embodiment, customers are provided with incentives to ensure that manual identification is completed. After a characteristic learning period, the ADS will be able to auto-identify an appliance that is plugged into an OMD.

Outlet Monitoring Device (OMD)

Figure 2:
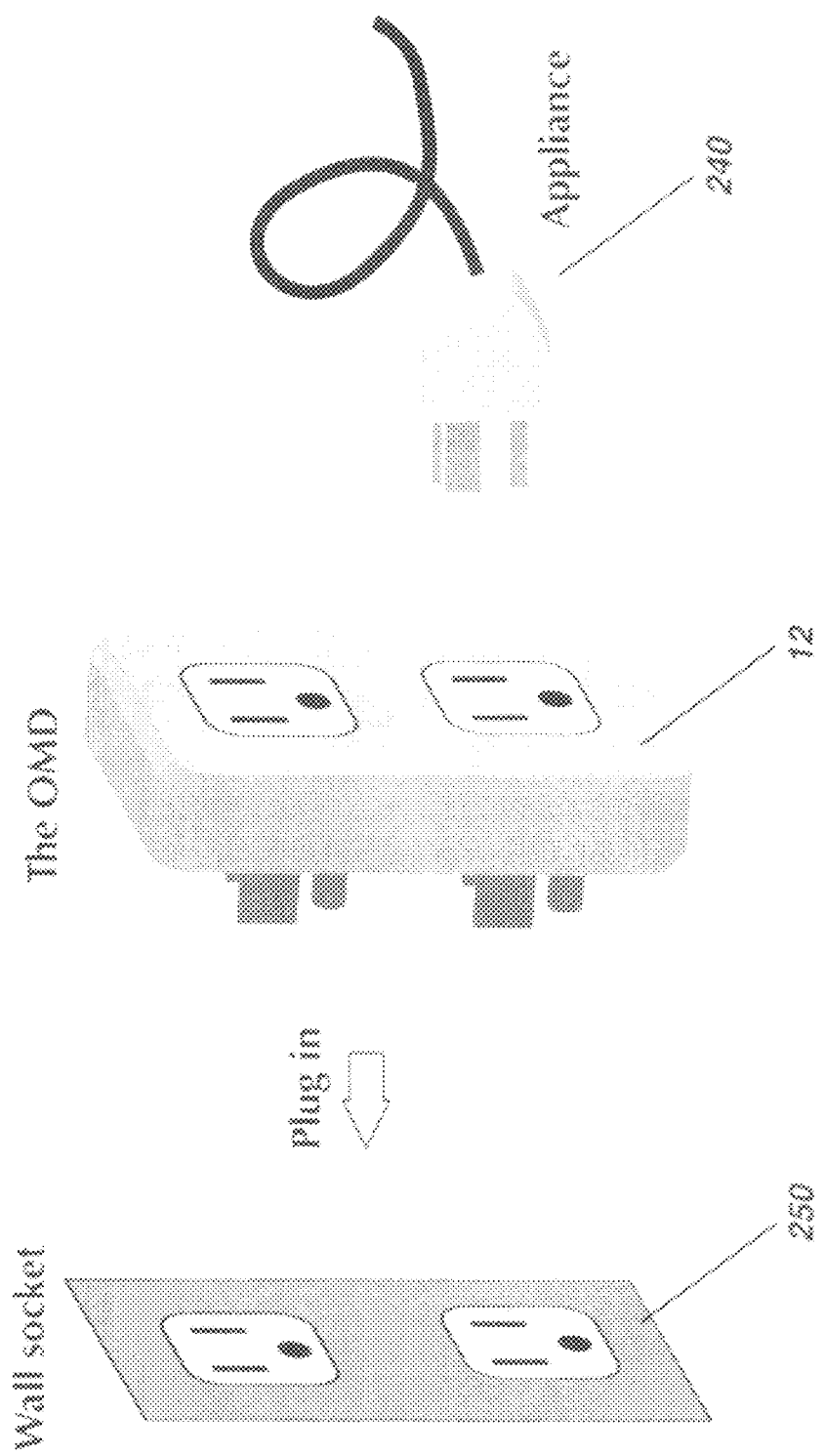
FIG. 2 is a functional representation of an outlet monitoring device (OMD) shown to be operatively connected to an existing electrical circuit.

Turning now to FIG. 2, there is shown an outlet monitoring device (OMD) 12 which is suitable for electrical coupling to an existing electrical circuit, such as by inserting OMD 12 into a wall socket (power outlet) 250, according to an embodiment of the invention. While in operation, once OMD 12 is inserted into wall socket 250, load 240 may be electrically coupled to OMD 12. Load 240 may have any configuration which consumes supplied electrical energy. Examples of load 240 include, but are not limited to, televisions, computers, clothes washing machines, clothes dryers, ovens, dishwashers, refrigerators, freezers, microwave ovens, trash compactors, automobiles, lamps, and removable countertop appliances, such as waffle makers, toasters, blenders, mixers, food processors, coffee makers and the like.

In one embodiment, OMD 12 accepts a standard plug for load 240. In the presently described embodiment, OMD 12 is configured as a dual socket OMD 12 where each socket of the outlet monitoring device (OMD) 12 is associated with a corresponding socket of wall outlet 250. It is noted that a key feature of the invention is that the use of OMD 12 permits the continued use of all outlets of a multi-port wall outlet by substantially conforming to the footprint of the wall socket to which it is attached, which in this embodiment shows the use of both outlets of dual-port wall outlet 250.

Figure 3:
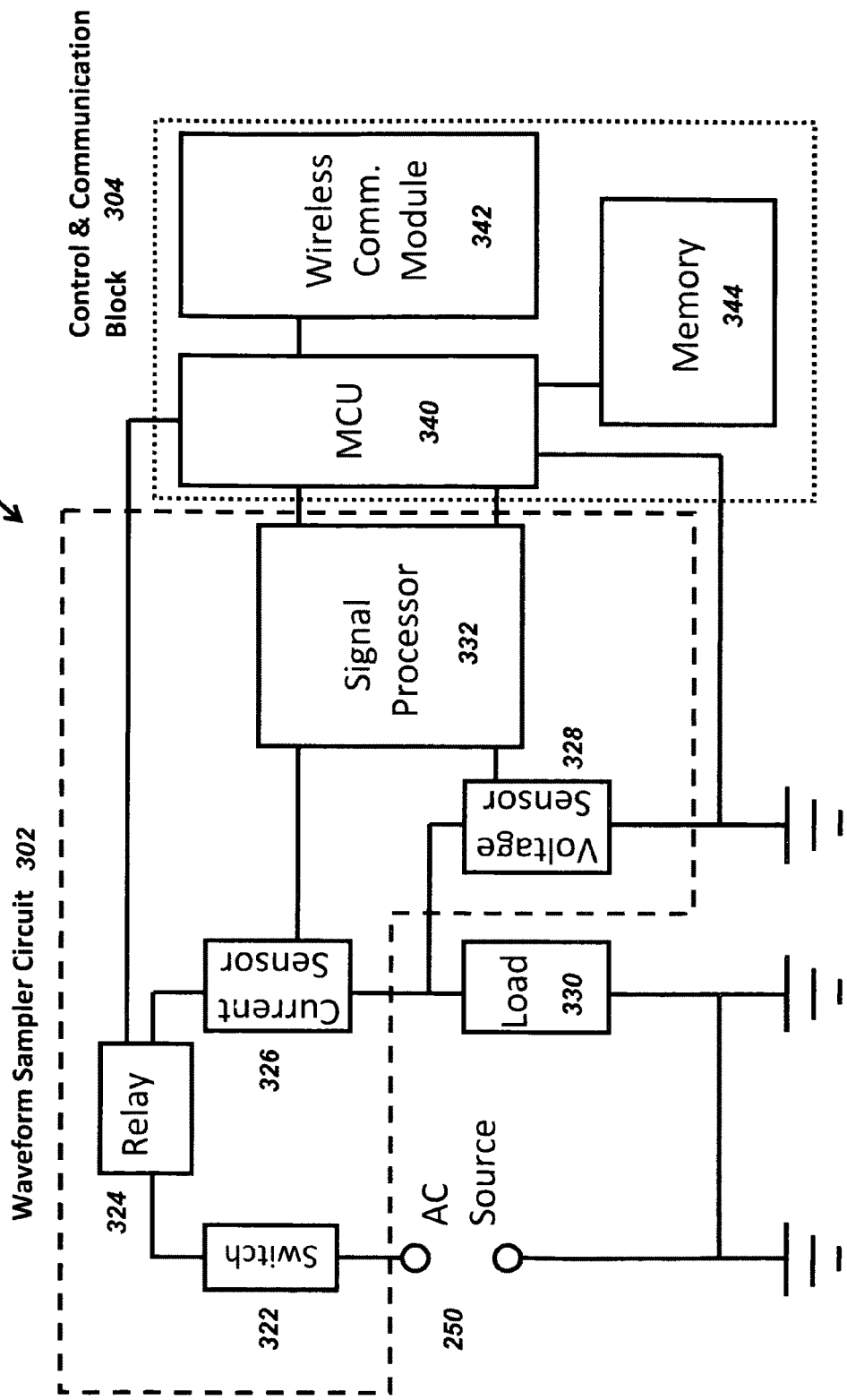
FIG. 3 is a functional circuit block diagram of a single outlet monitoring device (OMD), according to one embodiment.

FIG. 3 is a functional circuit block diagram of an outlet monitoring device (OMD circuit) 300 for a single socket embodiment. The OMD circuit 300 is generally comprised of a waveform sampler circuit 302 communicatively coupled to a Control and Communications Block (CCB) 304. For illustrative purposes, the CCB 304 contains a microcontroller unit (MCU 340) and memory 344.

Waveform Sampler Circuit

Waveform Sampler Circuit 302 is configured to sample the current and voltage waveforms across the load and apply necessary filtering to maintain high signal-to-noise ratios. In one embodiment, the waveform sampler 302 may be implemented as a highly integrated circuit, such as the ADE 7753 by Analog Devices (Norwood, Mass.). In the described embodiment, waveform sampler circuit 302 is comprised of a switch 322, connected to a wall socket 250 for switching the OMD 12 on when an appliance is plugged into the wall socket 250. In this embodiment, a current sensor 326 sits on the high side of the line, and a voltage sensor 328 sits in parallel to the load 330. The current sensor 326 could be any known or envisioned current sensor, including, for example, a resistive shunt, current transformer, Hall Effect sensor, or Rogowski coil. The outputs of the current 326 and voltage 328 sensors are isolated by pre-amplifiers (not shown). The rectification unit (not shown) could be any efficient rectification scheme that may, for example, be built on a buck converter and powers the active electronics from the AC line. A stage coupled to the rectification unit sets reference voltages, like ground, for voltage measurements with respect to the load. A signal processing module 332 filters out noise to enhance the signal-to-noise ratio using any known or envisioned method including, for example, passive and active analog filtering, digital signal processing, or any combination thereof. The waveform sampler circuit 302 includes a timing circuit (not shown) that sets the waveform sampling frequency. Sampling rates employed in the waveform sampler circuit 302 are dictated by the frequency characteristics of the load, and may be at least two orders of magnitude higher than the wireless communication transmission rate. If ZigBee is the preferred wireless communication protocol, given the ZigBee transmission rate of 250 kBytes/sec, the sampling rate employed in the waveform sampler circuit 302 may be greater than 100 kHz to mitigate errors arising in the de-muxing process, described below. The MCU 340 controls the relay 324, and can connect and disconnect the load 330 to the power source at the wall socket 250.

Control and Communication Block (CCB)

The Communication and Control block (CCB) 304 processes waveform data received from the waveform sampler circuit 302 and transmits the processed data to the system controller 50.

In one embodiment, the CCB 304 is comprised of MCU 340, Wireless Communications module 342 and Memory 344. MCU 340 and memory module 344 sample waveforms output from the waveform sampler circuit 302 at a sufficiently high rate so that calculations including appliance detection and power measurement can be performed at the system controller 50. The input to the wireless communication module 342 may be, in different embodiments, voltage waveforms, current waveforms, power waveforms, or a multiplexed signal containing any combination thereof. A power waveform may be either measured in an analog circuit or computed from current and voltage waveforms by the MCU 340.

Wireless Communication Module

Wireless communication module 342 can be any arbitrary wireless communicating component able to establish communications with a wireless communicating component coupled to an interface expander port of the system controller 50. In addition to employing modulation/demodulation, the wireless communication module 342 may, in certain embodiments, employ encoding/decoding and/or encryption/decryption, and/or compression methods.

In one embodiment, current and voltage waveforms from each OMD 12 are transmitted to the system controller 50 by the wireless communication module, where power calculations are performed by the system controller 50. In another embodiment, an analog circuit constructs the power waveform from the current and voltage waveforms. In this case, the wireless communication module transmits the current, voltage, and power waveforms to the system controller.

In various embodiments, the wireless communications can include standard or nonstandard communications. Some examples of standard wireless communications include link protocols including, but not limited to, Bluetooth™; IEEE 802.11 (wireless LANs); 802.15(WPANs); 802.16 (WiMAX); 802.20 mobile wireless; cellular protocols including, but not limited to CDMA and GSM, ZigBee, and ultra-wideband (UWB) technologies. Such protocols support radio frequency communications and some support infrared communications. It is possible that other forms of wireless communications can be used such as ultrasonic or optical. It is understood that the standards which can be used include past and present standards. It is also contemplated that future versions of these standards and new future standards may be employed, or encryption used, without departing from the scope of the present subject matter.

The ZigBee protocol is an exemplary protocol because it provides efficient wireless networking between multiple OMDs 12 and the system controller 50, but uses very little power (<100 mW), which makes it consistent with the energy conservation goal of the OMD 12. ZigBee is also a preferred protocol in that it facilitates self-organized, mesh networking, which leads to high connection quality in confined spaces (such as residences) having multiple ZigBee transmitters.

Micro-Controller (MCU)

Figure 4A:
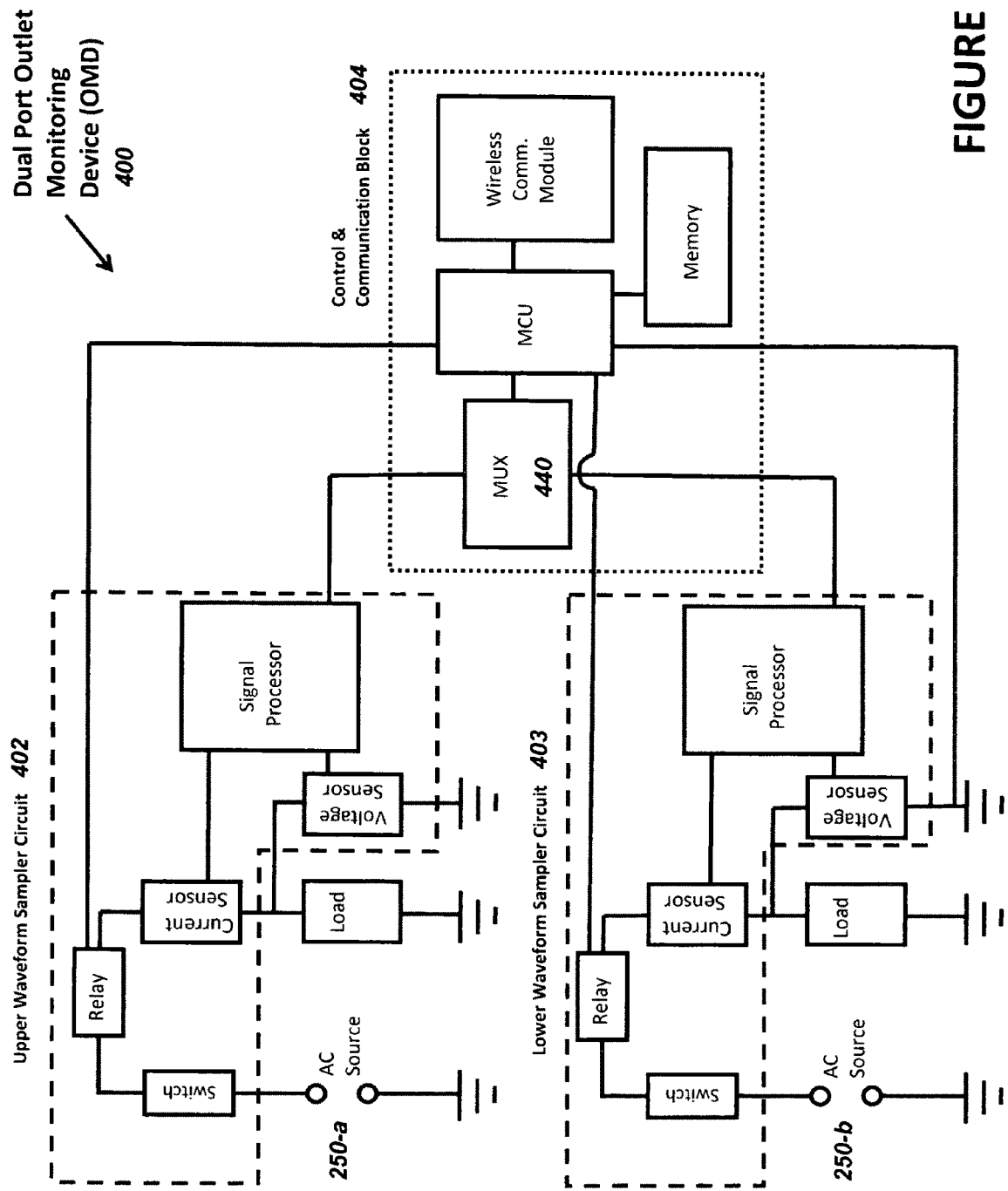
FIGS. 4a & 4b are functional circuit block diagrams of a dual-port outlet monitoring device (OMD) utilizing a switching module, according to embodiments of the invention.
Figure 4B:
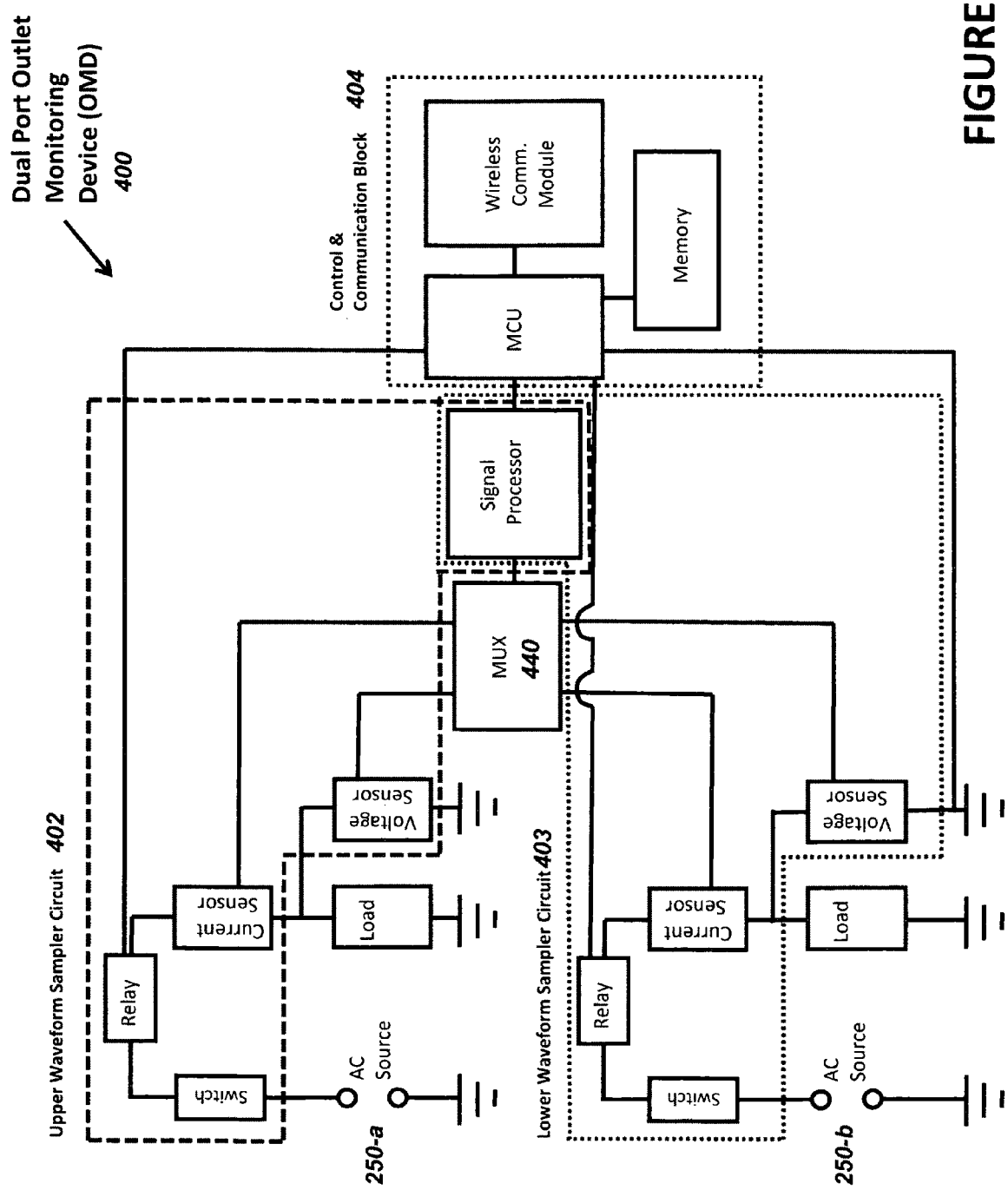

The microcontroller 340 coordinates the operations of the waveform sampler circuit 302, control and communication block 304 and switching module 406 (See FIGS. 4*a* and 4*b*, OMD dual socket configurations). Microcontroller 340 is configured to receive the current and voltage waveforms and/or a muxed signal as an analog input. The primary output is a digitized version of the muxed signal to be transmitted either to memory 344 or communication module 342. Other outputs generated by microcontroller 340 include simple operational instructions to the relay 324 or signal processor 332, described below in connection with OMD 12 control tasks.

In addition to receiving and generating signals as described above, the microcontroller 340 is configured to (a) perform analog-to-digital conversion on the muxed signal, (b) apply any kind of filter, which may include collaboration with a DSP (digital signal processing) chip to improve output digital signal quality, (c) interface with memory 344 to read/write waveforms, (d) interface with communications module 342 to manage data communications, (e) interface with LED drivers, (f) perform simple calculations related to appliance detection, and (g) manage overall OMD control tasks. OMD control tasks may include, for example, (a) turning the electricity to the load "on/off" as requested by the system controller 50, (b) managing user options related to the LED display, waveform sampling and/or mux circuitry, and (c) calibrating the internal circuitry (e.g., synchronizing internal clocks).

Memory

In some embodiments, the OMD 12 includes memory 344 for storing data including, but not limited to, data output from the waveform sampler circuit 302. In an embodiment, memory 344 is a flash memory that enables the system controller 50 to turn individualized OMDs 12 on or off without risking a loss of data. In some embodiments, the memory is a non-volatile memory (such as EEPROM) of at least 32 kB in size having data access times less than or equal to 1 ms. Memory 344 stores digitized waveform data output from the MCU 340. Memory 344 stores the digitized waveform data in those cases where system controller 50 is turned off, or when the sampling frequency exceeds the communication frequency. Once the communications module 342 of the OMD 300 senses that system controller 50 is turned "on", the OMD 300 transmits the stored data to system controller 50. Once memory 342 reaches capacity, older stored data is overwritten with newer data in first in first out (FIFO) fashion.

LED/LCD Display

In one embodiment, an LED or LCD display is coupled to micro-controller 340 or to a power metering IC (not shown) to provide immediate feedback to a user on the amount of power being used by an appliance. In one embodiment, a visual LCD display shows the user a number of tracked parameters including average energy use, instantaneous power use, power factor, voltage and current RMS levels. Further, the parameters are displayed in various units of interest, including, without limitation, dollars spent, kWh, kW, volts, and amps. It is further contemplated to use the numerical LED to indicate that an appliance is plugged in. In an embodiment, a number of LEDs are used to indicate the various device states of the OMD 12. For example, a green LED indicating that the OMD 12 is "on", a red LED indicating that the OMD 12 is "off" and a blinking green LED indicating that the OMD 12 is transmitting data.

Dual Port OMD

Referring now to FIG. 4*a* and FIG. 4*b*, there is shown a detailed circuit diagram 400 of an OMD 12 OMD for a dual-port socket embodiment. In such an embodiment, the upper and lower waveform sampler circuits 402, 403 are coupled to switching module 440, which is configured to send the outputs of both sampler circuits to a single control and communication block 404. In effect, the switching module 440 enables waveform data of adequate time resolution to be captured from both sockets in real time.

Switching Module

FIG. 4*a* and FIG. 4*b* are functional circuit diagrams illustrating how switching module (MUX 440) couples both outlets (i.e., the upper waveform sampler circuit 402 and the lower waveform sampler circuit 403) of OMD circuit 400, according to different embodiments. Advantageously, the switching module 440 precludes the need to duplicate critical components in the OMD circuitry 400, which would otherwise double the cost and footprint of the OMD 12.

Switching module 440 of the OMD circuit 400 enables a single OMD 12 to be used to sample current and voltage waveforms from both outlets of a dual wall power outlet 250. Switching module 440 utilizes a multiplexing technique, sometimes referred to as muxing, to enable alternate sampling from both outlets so that two sets of current and voltage waveforms of sufficient time resolution to be captured simultaneously.

Figure 5A:
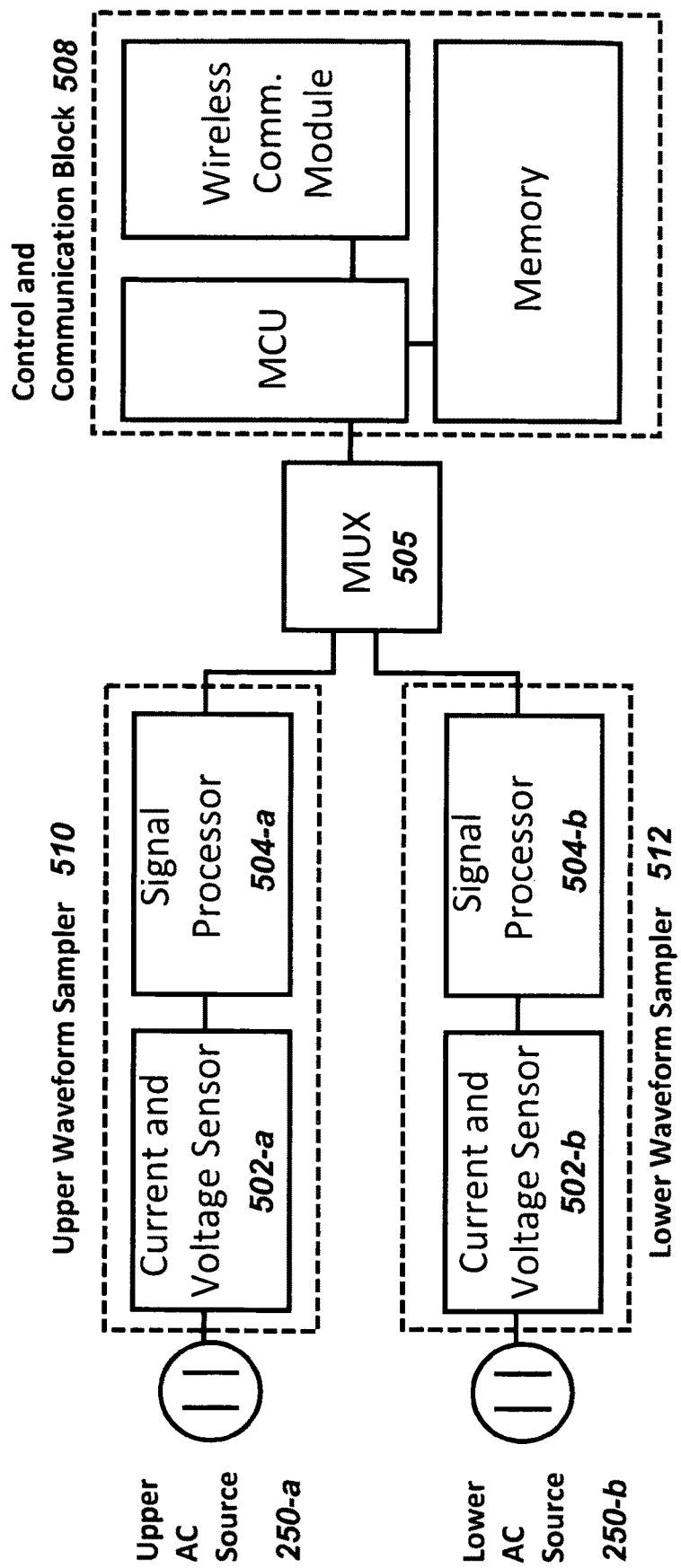
FIGS. 5a & 5b are simplified block diagrams illustrating the functional operation of the switching module, according to same embodiments of the invention as FIGS. 4a and 4b, respectively.
Figure 5B:
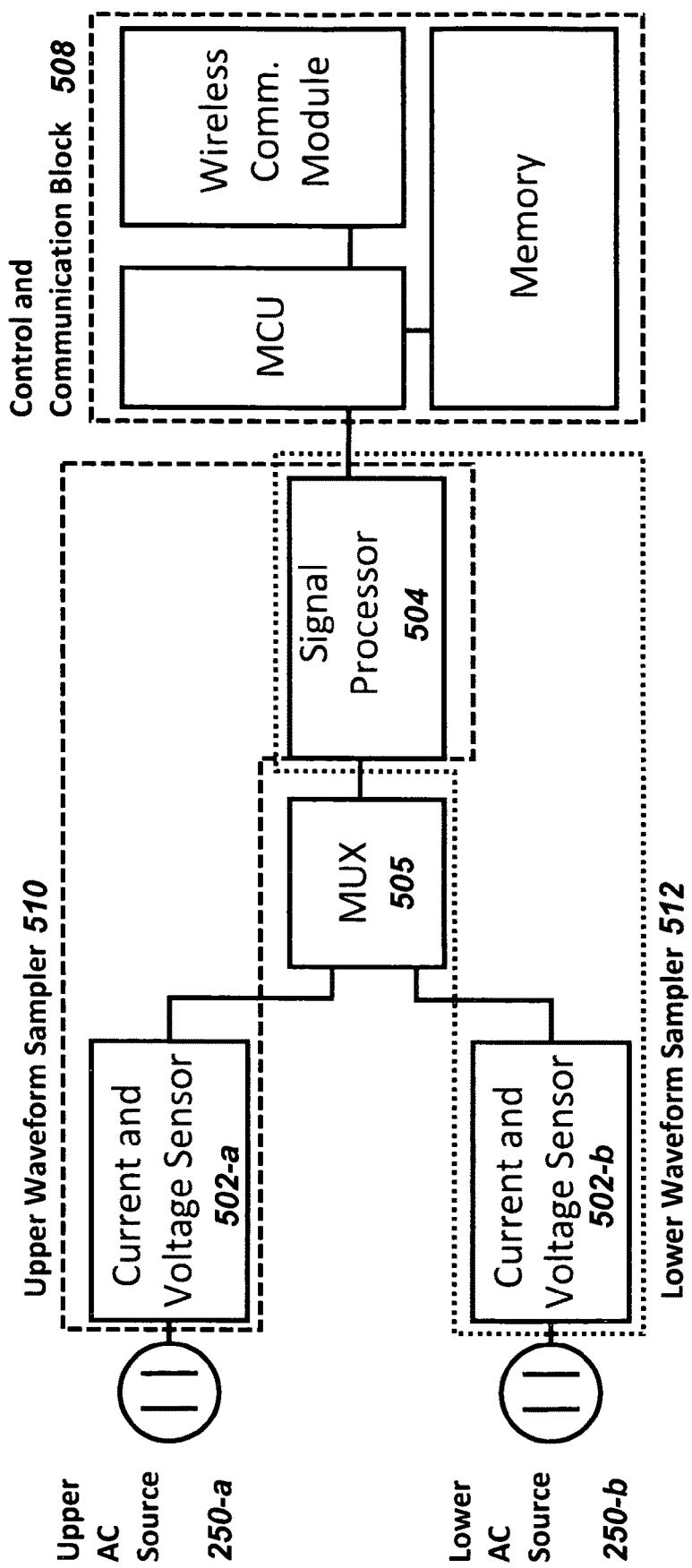

FIGS. 5*a* and 5*b* represent the same two embodiments of the switching mechanism depicted in FIGS. 4*a* and 4*b*, respectively. However, FIGS. 5a and 5b illustrate the switching mechanism in simplified block diagram form so as not to obfuscate discussion of the switching mechanism.

In the embodiment illustrated in FIG. 5a each outlet of a dual wall power outlet 250-a, 250-b is connected to its own voltage/current sensor 502 followed by its own signal processor 504, so that waveforms from each outlet are sampled separately. The sampled data streams from the upper and lower waveform sampler circuits 510, 512 respectively are fed into a mux 505 to generate a single, combined data stream that is sent to the control and communication block 508.

In the embodiment of FIG. 5b, each outlet of a dual wall power outlet 250 is connected to its own voltage/current sensor 502. A mux 505 generates a single, combined data stream from the raw streams of sensor data from the two outlets. The single combined stream is then sampled through a single signal processor 504 and distributed to the control and communication block 508.

Different techniques are contemplated for multiplexing the two data streams via mux 505. In one embodiment, time-division multiplexing is used, in which two signals are interleaved by alternately sampling from each signal stream according to a timing signal from an internal clock circuitry on the device. The internal clock may contain a long shelf-life battery to avoid frequent synchronization with an external clock source. In another embodiment, the two signals are added from the respective signal streams after delaying one signal by half a period using an electronic phase shifter.

Power Strip Embodiment

In one embodiment, a power strip incorporates the fundamental OMD power metering/wireless capabilities with waveform multiplexing, discussed above in the context of a dual wall outlet. In another embodiment, it is contemplated to incorporate the fundamental OMD power metering/wireless capabilities to handle appliances with large currents draws (such as washer/dryers).

Network Communication Between OMD Clients

Figure 6A:
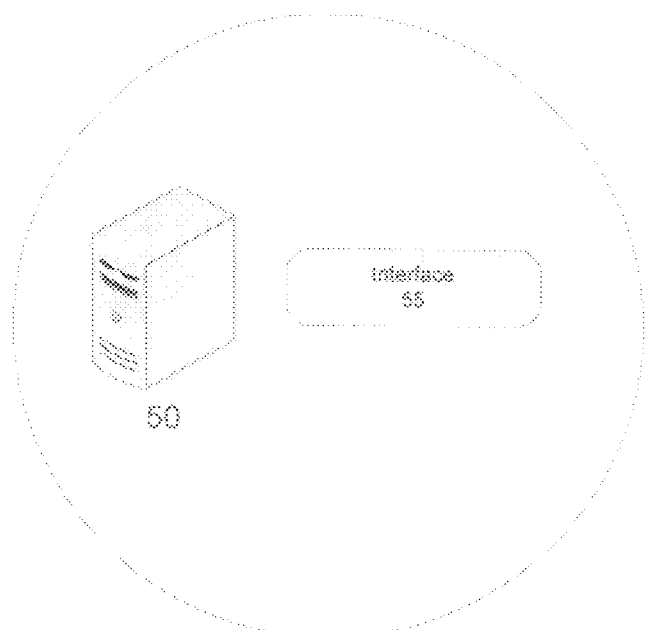

FIG. 6a is a block diagram illustrating the functional operation of the data communication between the OMDs 12 and system controller 50. In this embodiment, interface 55 is a small USB unit that plugs directly into the system controller 50, allowing for data transfer whenever the system controller is not turned off.

Figure 6B:
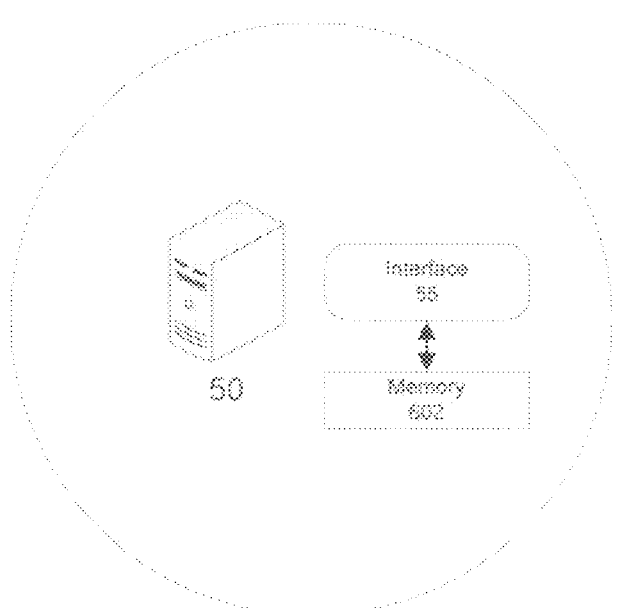

FIG. 6b is a block diagram illustrating the functional operation of the data communication between the OMDs 12 and system controller 50, according to a second embodiment. In this embodiment, interface 55 includes an intermediate memory unit 602 that is capable of continuously receiving and storing time-stamped data from all OMDs 12 in queue. This memory unit then transfers data to system controller 50 when it is turned on. In this embodiment, memory 344 on the OMD unit will not have to store waveform data.

FIG. 6c is a system diagram 600 for monitoring and managing utility usage, according to one embodiment. System 600 comprises a system management node 70 including a gateway computer 76 for receiving communications from distributed client computers (system controller) 50 via the Internet 60, a first processor for reading information (including signatures of devices) and writing information (including anonymized usage information) to and from database 78, and a second processor 74 that serves machine- or human-readable reports, such as the total amount of electricity used by a group during a specified time period.

The gateway computer 76 will be the primary interface to System 600 with the distributed client computers 50. Gateway computer 76 is configured to ensure that the other elements that make up system 600 remain isolated from the Internet for security purposes. Gateway Computer 76 receives information from the distributed nodes 50, for example, usage patterns or energy use on various appliances and confirms that the received information is not corrupted or poses a security threat. Gateway Computer 76 forwards the received data to computer 72, a computer that can read from and write to database 78.

Processor 74 receives requests for human- or machine-readable reports from the client (node 50), or a social networking site 604. Examples of human-readable reports include a request to see how much electricity a group of users has used during a particular time period. This request could originate either from Node 50 (e.g., client software gives user update on how much energy a group has used), or a social network node 604 (e.g., PHP code running on a platform of a social networking site such as Facebook on a page associated with a particular group, requests a graph illustrating how the group has reduced its energy use.) Examples of machine-readable reports include a request to receive the power consumption characteristics for a particular device. Upon receiving a report request, processors 74 examines the report request and first confirms it is not a security threat, privacy violation, or other malicious request. It then passes on the request to a computer 72 that can read from database 78, which will execute the query and return the information to processor 74. Upon receiving the returned information, processor 74 formulates the data into the appropriate human- or machine-readable format, and communicates it back to the requesting client via the Internet 60.

The OMDs 12 associated with each residence, e.g., residence 1 and 2, shown by way of example, include hardware circuitry and software components required for communicating via ZigBee or another wireless protocol with system node 70. In one embodiment, communications are received by a ZigBee module included as a component of each OMD 12, which will then transmit information via a USB or serial port to a PC 50, or otherwise cache the information in the case where the PC 50 is in an OFF state. A daemon (not shown) on the PC 50 will receive the information, and communicate it to an application running on the client.

Software Architecture

The software ("OMD soft") includes several interoperating pieces. An OMD soft communication daemon will run on a user's computer and be responsible for communicating with the OMD via a wireless protocol (e.g., ZigBee). Whenever the computer is turned on, an OMD soft daemon will connect to the device and download all cached data. While the computer is running, it will collect information in real time. It will communicate this information to the thick client.

A thick client will receive information from the daemon and connect to one or more system servers via the Internet to send and receive information. The thick client is configured to display information in real time, allow users to join or create groups and support all the functionality mentioned below. The system servers receive information from all clients and store it in a relational database. The servers also receive intermediate queries from clients about total energy use per individual, broken down by appliance type, about groups of users, etc.

Thin clients may be hosted on third parties like Ning or Facebook. They may be written in PHP or a similar language.

They may also contain a mashup with other databases, such as Google Maps. Thin clients will primarily be used to display information on appliances or user performance.

Individual users may configure thin clients, using a GUI provided by a third party or on the thick client. For example, a user who is leading a group may design the home page for that group on Ning, but use the thick client to invite other OMD users to join.

Application Programming Interface (API)

In one embodiment, an API and set of libraries would be provided that enable third party software to interface with the invention described herein. Elements of this interface would include notification when certain events take place (outlets turned on, off, or changing power), and also give third parties the ability to turn OMDs on or off.

In different embodiments, the API may be embodied as software running on the same PC that hosts a thick client, or by publishing the interface used to control devices via the Zigbee network.

For example, a third party might take advantage of this API to design a coffee maker that turns on when the bedroom lights are turned on a weekend morning, or software that tracks when a babysitter turns off the lights in a child's bedroom.

Table Descriptions

The following tables will be present on both the client machine (system controller 50) and the central server machines (database 78), except as noted. They may be implemented as tables in a database, data stored on disk, data structures stored in RAM, or in similarly suitable storage structures.

Entity-Relationship Diagram

Figure 7:
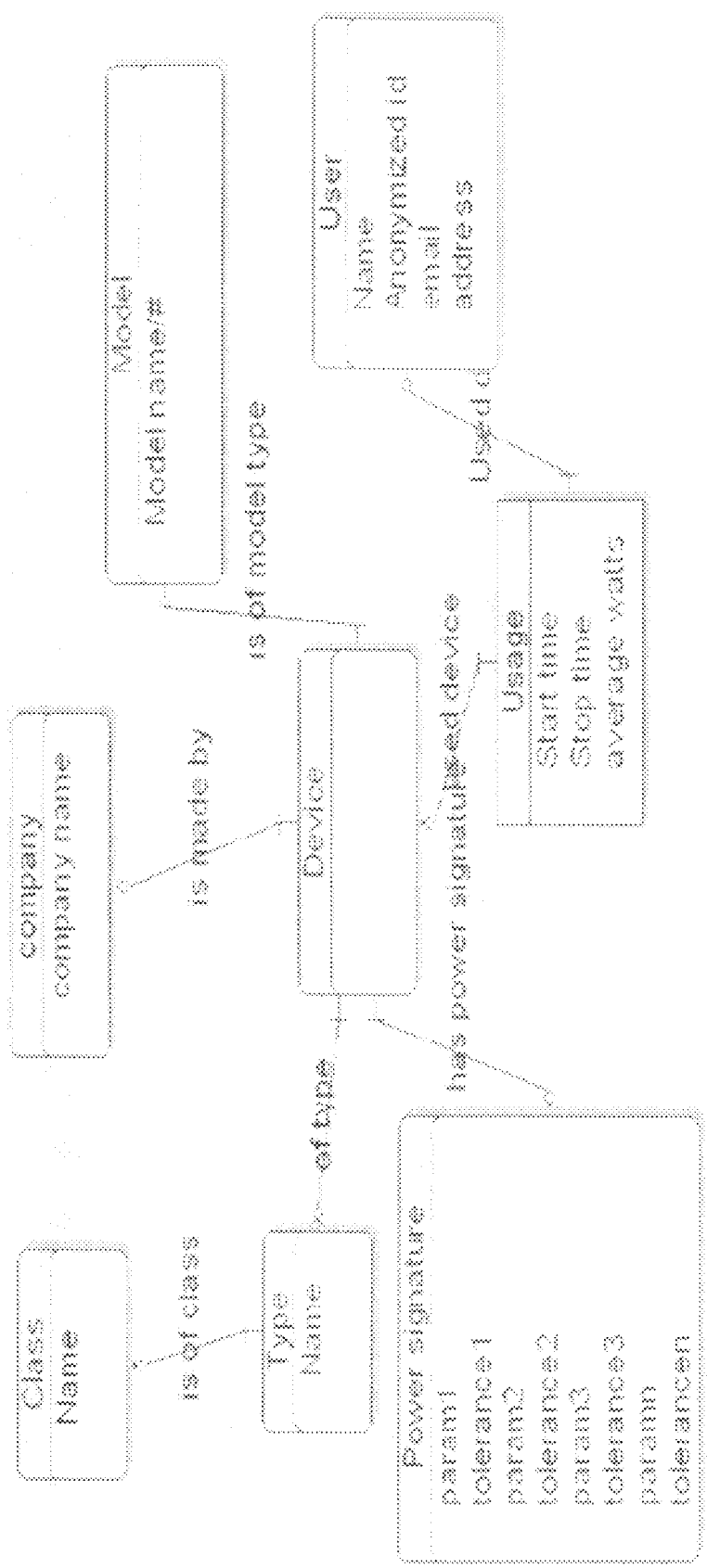
FIG. 7 is an entity-relationship diagram of the tables implemented by the system database for use therewith of the present invention.

FIG. 7 illustrates an entity-relationship diagram of the tables implemented by the system database, according to one embodiment. In this embodiment, the database will be in third normal form, with a device table as the primary relationship table. Several other tables give additional information on each device.

Device Power Signature Table

FIG. 8 is a field description of a Device Power Signature Table 800, according to one embodiment. The Device Power Signature Table 800 describes a plurality of devices commonly found in a residential setting. Fields of the device table include, a Links field 802 describing links to a device type (e.g., light bulb) and class (e.g., cooling, lighting, etc), device power signature fields 804-814 describing a unique waveform-based identifying signature for each device, which consists of n different parameters (and tolerance levels). The n parameters represent a "best guess" of parameters that can be used for identifying different devices. Similar information will be stored locally on the user's computer, which will contain information specific to the user's own devices.

Usage Table

FIG. 9 is a field description of a Usage Table 900, according to one embodiment. The Usage table stores the particular usage of a particular device by a particular user. Fields of the Usage table, according to one embodiment, include foreign keys pointing to the device (field 902) and user (904), a field start time 906, a field stop time 908, and a third field power draw 910. For example, if a device draws 100 watts from 8:00 PM to 8:01 PM, then the first row of the table will have entries of 8:00 PM, 8:01 PM and 100 W, and the second row will have entries of 8:01 PM, 8:05 PM and 40 W.

User Table

FIG. 10 is a field description of a User Table 1000, according to one embodiment. The User table stores information by user, which may primarily be by an anonymous ID. Fields of the User table include at least a Name field 1002 and an anonymized ID 1004. The Name field 1002 is the self-reported name of a user of the OMD. The anonymized ID 1004 will be assigned by a central database and will identify this household to the network. Depending on the user's preferences, it may not be possible to associate the anonymous ID with any identifying information. In some embodiments, other identifying indicia, such as, for example, address 1006, email 1008, and phone 1010 may also be included. The user table on the client machine will have only a single row, or at most one row for each family member. Because of this, information may be stored in a data structure other than in a table.

GUI Interfaces

Figure 11:
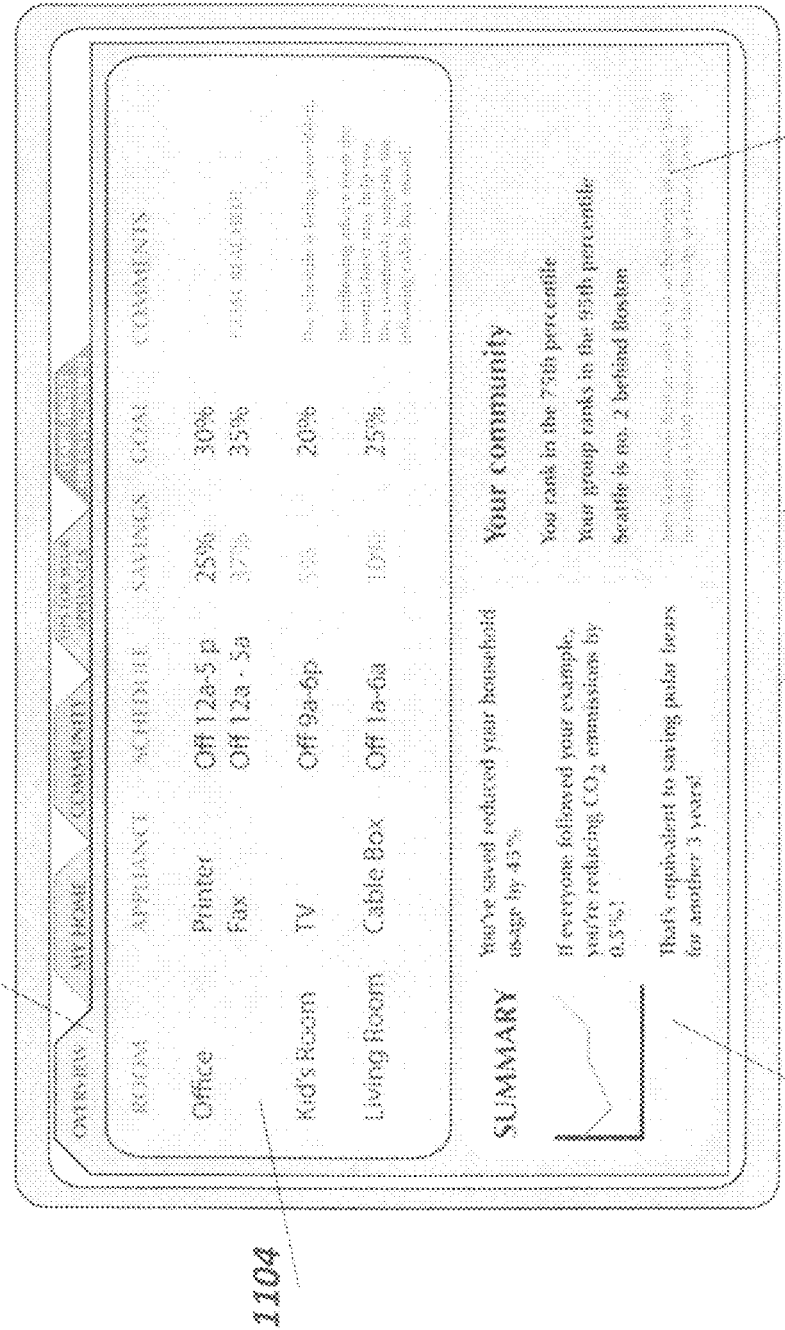
FIG. 11 is an exemplary GUI interface contemplated for displaying a variety of parameters associated with electricity consumption and appliance usage.

FIG. 11 illustrates an exemplary GUI interface contemplated for displaying a variety of parameters associated with electricity consumption and appliance usage. In this embodiment, there are several tabs 1102 that users can toggle between based on their interest. Some tabs are designed to show and manipulate data collected via the OMDs 12 (e.g. 'Overview', 'My Home'), while others provide content and links to related topics of interest (e.g. 'Tips for your Appliances', 'Learn About the Environment').

In the 'Overview' tab shown in FIG. 11, a first table 1104 depicts how the user can use the GUI to program appliance on-off states that OMDs 12 around the site can execute. Furthermore, the potential savings from the programmed on-off states are forecasted based on the data history collected by the OMDs 12, so that a user can optimize on-off preferences to his/her liking. In this embodiment, appliances are clustered by consumer site room to facilitate scheduling, but other methods of organization are possible for the user to choose.

A second summary panel 1106 indicates the overall electricity savings that a consumer site has achieved over a certain period of time, with motivational tidbits about the impact level that such conservation efforts have on the environment. In addition, a small time series chart depicts the overall trend in electricity usage at that consumer site to remind users that their savings are based on actual collected data.

Finally, a third panel 1108 shows community-level updates that are relevant to the consumer site, so that OMD users can remain up-to-date on community conservation efforts and performance.

Another GUI contemplated for use with the invention (not shown) would allow the user to request granular information concerning various aspects of energy consumption such as, for example, appliance usage trends, direct comparisons of electricity usage at different time scales, cross-referenced data, and answers to "What if" scenarios. This information would be accessed through another tab on the GUI, e.g. 'My Home' tab.

Other GUIs contemplated for use by the invention include the following:

Customizable summary table that updates user on his/her most wanted information

Links to other sites of interest, e.g. social networking, environmental education or appliance tips News and current events page that is updated regularly Privacy Considerations It is noted that personalized data is never required to be passed to a centralized database to perform the process flow 700. The process flow does, however, require (a) device power signatures and (b) appliance descriptions/definitions from the centralized database. Both of these parameters are obtained as averages of centralized data, which were collected over time from users who volunteered personal usage data or corporate (appliance manufacturers/distributors) sources.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

What is claimed is:

1. A system for collecting waveform data for determining at least one energy consumption profile, the system comprising:
   (I) a system controller;
   (II) a plurality of co-located multi-port monitoring devices, wherein each of said multi-port monitoring devices comprises:
   a) communication coupling means for communicating with the system controller;
   b) at least one plug that is configured to electrically couple to at least a dual-port electrical outlet upon being inserted into a socket of said at least dual port electrical outlet, wherein each of said multi-port monitoring devices comprises at least one relay to connect and disconnect to a power load and each of said multi-port monitoring devices is configured to:
   a) independently meter waveform data from a single port of said at least dual port electrical outlet in the case where a single electrical appliance is coupled to said single port of said multi-port monitoring device;
   b) independently meter waveform data from multiple ports of said at least dual port electrical outlet in the case where at least two electrical appliances are simultaneously coupled to at least two ports of said multi-port monitoring device; and
   c) wirelessly transmit the metered waveform data to the system controller.

2. The system of claim 1, wherein said waveform data comprises at least one characteristic of electrical energy consumed by at least one electrical appliance.

3. The system of claim 1, wherein said waveform data is selected from the group consisting of: a current waveform, a voltage waveform, a current and a voltage waveform, and a power waveform.

4. The system of claim 1, wherein the system controller is configured to store, organize and analyze the waveform data that is transmitted to the system controller to determine at least one energy consumption profile.

5. The system of claim 1, wherein the system controller is configured to transmit communication signals to particular multi-port monitoring devices from among the plurality of co-located multi-port monitoring devices.

6. The system of claim 1, wherein the system controller is configured to request transmissions from particular multi-port monitoring devices from among the plurality of co-located multi-port monitoring devices.

7. The system of claim 1, wherein each multi-port monitoring device is assigned a unique address to allow the system controller to individually identify a particular multi-port monitoring device interacting with the system controller.

8. The system of claim 1, wherein the system is physically configured to operate on a per-room and/or per-floor basis, wherein each room or floor includes at least one multi-port monitoring device electrically coupled to an electrical outlet.

9. The system of claim 1, wherein the plurality of multi-port monitoring devices are configured to transmit the metered waveform data to the system controller either periodically or on demand.

10. The system of claim 1, wherein the plurality of multi-port monitoring devices are configured to temporarily store the waveform data.

11. The system of claim 1, further comprising an interface coupled to the system controller configured to receive time-stamped secure data packet transmissions from the plurality of multi-port monitoring devices and queue the data packet transmissions from the plurality of multi-port monitoring devices in the order in which they were received.

12. The system of claim 1, wherein the plurality of multi-port monitoring devices communicate with the system controller via a wireless communications protocol.

13. The system of claim 1, wherein the multi-port monitoring device substantially conforms to a footprint of the at least dual-port electrical outlet.

14. The system of claim 1, wherein the multi-port monitoring device is configured as a power strip.

15. The system of claim 1, wherein the at least one energy consumption profile is determined on one of: a per user basis, a per appliance basis, or a per location basis.

16. The system of claim 1, wherein the system controller is further configured to calculate a cost for energy consumption per user, per appliance, or per location.

17. The system according to claim 1, wherein the at least one plug is on a first side of the device and a second side the device is configured to receive at least one a plug of an electrical appliance.

18. The system of claim 17 further comprising an electrical appliance plugged in to the second side of the device.

19. A multi-port monitoring device configured to be electrically coupled to a multi-port electrical outlet, the device comprising:
   a first waveform sampler circuit configured to sample at least one of a current, a voltage and a power waveform across a first load electrically coupled to a first port of the multi-port electrical outlet via the multi-port monitoring device, and the multi-port monitoring device comprises a first relay to connect and disconnect to the first load; and
   at least a second waveform sampler circuit configured to sample at least one of a current, a voltage and a power waveform across a second load electrically coupled to a second port of the multi-port electrical outlet via the multi-port monitoring device, and the multi-port monitoring device comprises a second relay to connect and disconnect to the second load;

switching means coupled to the first and the at least second waveform sampler circuits, said switching means for multiplexing a first and a second waveform data stream from said first and said at least second waveform sampler circuits; and a control and communication circuit communicatively coupled to the switching means for receiving said multiplexed first and second waveform data streams and for communicating said first and second waveform data streams to a remote system controller, wherein a first side of the device comprises a plug for engaging said multi-port electrical outlet through a socket and a second side of the device is configured to receive at least one plug from at least one electrical appliance.

20. The multi-port monitoring device of claim 19, wherein the switching means is a multiplexer.

21. The multi-port monitoring device of claim 19 wherein the first waveform sampler circuit comprises:
 a switch coupled to a socket of the electrical outlet for switching the multi-port monitoring device to an on state when the load is connected to the electrical outlet;
 a current sensor for sensing current drawn by the load; and
 a voltage sensor for sensing voltage drawn by the load.

22. The multi-port monitoring device of claim 19, further comprising a timing circuit for setting the frequency of waveform sampling.

23. The multi-port monitoring device of claim 19, further comprising a signal processing module.

24. The multi-port monitoring device of claim 19, wherein the control and communication circuit comprises:
 a wireless communication module configured to communicatively couple to an interface expander port of a system controller;
 a memory
 a micro-controller configured to:
 (a) perform analog-to-digital conversion on a muxed signal received at an input of the micro-controller;
 (b) apply a filter to improve an output digitized muxed signal;
 (c) interface with the memory to read/write waveforms, and
 (d) interface with the wireless communications module to manage data communications.

25. The multi-port monitoring device of claim 19, wherein the micro-controller is further configured to:
 a) interface with LED drivers;
 b) perform calculations related to appliance detection; and
 c) manage OMD (outlet monitoring device) control tasks including:
 turn the electricity to the load "on/off" according to the scheduling program maintained by the system controller, and
 manage user options related to the LED display, waveform sampling and/or mux circuitry, and calibrate the internal circuitry.

26. A method for collecting waveform data for a plurality of loads to determine at least one energy consumption profile, the method comprising the steps of:
 independently metering waveform data generated by a corresponding plurality of loads in real-time using a plurality of multi-port monitoring devices thereby forming metered waveform data, wherein each of said multi-port monitoring devices comprises at least one relay to connect and disconnect to a power load and each of said multi-port monitoring devices is configured to simultaneously meter waveform data generated by at least two loads;
 transmitting the metered waveform data to a system controller; and
 analyzing the metered waveform data at the system controller to determine the at least one energy consumption profile, wherein a first side of each device comprises at least one plug for engaging said multi-port electrical outlet through a socket and a second side of each device is configured to receive at least one plug from at least one electrical appliance.

27. The method of claim 26, wherein said waveform data comprises at least one characteristic of electrical energy consumed by said at least one electrical appliance.

28. The method of claim 26, wherein the metered waveform data is communicated wirelessly from each of the plurality of multi-port monitoring devices to the system controller.

29. The method of claim 26, wherein the metered waveform data is communicated via a wired connection from each of the plurality of multi-port monitoring devices to the system controller.

30. The method of claim 26, further comprising the step of storing the metered waveform data prior to the step of communicating the metered waveform data to the system controller.

31. The method of claim 30, wherein the step of storing the metered waveform data further comprises storing the metered waveform data in a compressed format.

32. The method of claim 31, wherein the step of analyzing the metered waveform data at the system controller to determine at least one energy consumption profile further comprises computing power consumption parameter values from the metered waveform data to obtain power consumption information.

33. The method of claim 32, further comprising means for distributing the power consumption parameter information to users.

34. The method of claim 26, wherein the step of transmitting the metered waveform data generated by each load to a system controller further comprises, transmitting time-stamped secure packet messages from each OMD (outlet monitoring device) to the system controller at a system controller interface.

* * * * *